(12) United States Patent
Schwanke et al.

(10) Patent No.: US 8,250,748 B2
(45) Date of Patent: Aug. 28, 2012

(54) METHOD FOR PRODUCING AN LTCC SUBSTRATE

(75) Inventors: Dieter Schwanke, Hof (DE); Christian Zeilmann, Bayreuth (DE); Michael Krenkel, Vaihingen (DE)

(73) Assignee: Biotronik CRM Patent AG, Baar (CH)

( * ) Notice: Subject to any disclaimer, the term of this patent is extended or adjusted under 35 U.S.C. 154(b) by 361 days.

(21) Appl. No.: 12/548,311

(22) Filed: Aug. 26, 2009

(65) Prior Publication Data

US 2010/0059255 A1    Mar. 11, 2010

(30) Foreign Application Priority Data

Sep. 8, 2008  (DE) .......................... 10 2008 041 873

(51) Int. Cl.
*H01R 9/00* (2006.01)
*H05K 3/00* (2006.01)
(52) U.S. Cl. ............. 29/843; 29/851; 174/255; 428/209
(58) Field of Classification Search .................... 29/830, 29/840, 843, 846, 851, 852; 174/255, 261; 257/737; 427/97.4, 261; 428/209, 210, 697, 428/901
See application file for complete search history.

(56) References Cited

U.S. PATENT DOCUMENTS

| | | | |
|---|---|---|---|
| 5,156,903 A * | 10/1992 | Okumura et al. | ............. 428/209 |
| 6,187,680 B1 | 2/2001 | Costrini | |
| 6,288,905 B1 | 9/2001 | Chung | |
| 6,408,511 B1 * | 6/2002 | Branchevsky | .................. 29/843 |
| 2005/0174407 A1 | 8/2005 | Johnson | |
| 2006/0022311 A1 | 2/2006 | Lin | |

FOREIGN PATENT DOCUMENTS

| | | |
|---|---|---|
| DE | 2150695 | 4/1973 |
| DE | 4115316 | 3/1992 |
| DE | 19646369 | 5/1998 |
| EP | 0 607 732 | 7/1994 |
| EP | 1 017 098 | 7/2000 |
| WO | WO2007140463 | 12/2007 |

OTHER PUBLICATIONS

European Search Report for priority application, dated Apr. 8, 2010, 3 pages.
Renn M J et al. "Maskless Deposition Technology Targets Passive Embedded Components" 7th Annual Pan Pacific Microelectronics Symposium 2002, Proceedings, Feb. 5, 2002, pp. 296-300.
German Search Report for priority application, dated Jul. 6, 2009.

* cited by examiner

*Primary Examiner* — Donghai D. Nguyen
(74) *Attorney, Agent, or Firm* — ARC IP Law, PC; Joseph J. Mayo

(57) ABSTRACT

An LTCC substrate structure with at least one contact element for connecting a wire conductor, which has a first metallization (20) arranged on and/or in the ceramic substrate for electrical connection to the wire conductor, wherein the first metallization (20) preferably contains silver or a silver alloy. To avoid via posting or a plating process, a diffusion barrier layer covering the first metallization or metal layer, which diffusion barrier layer (22) covering the first metallization (20), which diffusion barrier layer is produced with a locally acting application method, and a second metal layer (24) arranged on the diffusion barrier layer (22) are provided, wherein the second metal layer (24) preferably contains gold and/or platinum and/or an alloy that has at least one of these elements. The invention also discloses a production method for an LTCC substrate structure of this type.

5 Claims, 2 Drawing Sheets

METHOD FOR PRODUCING AN LTCC SUBSTRATE

This application takes priority from German Patent Application DE 10 2008 041 873.0, filed 8 Sep. 2008, the specification of which is hereby incorporated herein by reference.

BACKGROUND OF THE INVENTION

1. Field of the Invention

Embodiments of the invention relate to a low temperature cofired ceramics (LTCC) substrate structure with at least one contact element for connecting a wire conductor, which has a first metallization arranged on and/or in the ceramic substrate, which metallization preferably contains silver or a silver alloy, for electrical connection to the wire conductor, and a method for producing a substrate structure of this type.

2. Description of the Related Art

Currently, substrate structures for ceramic printed circuit boards are often produced by means of the so-called LTCC technology (LTCC=low temperature cofired ceramics). This technology renders possible a cost-effective production of multilayer circuits with integrated passive elements on the basis of sintered ceramic substrates. The term "cofired" hereby describes the possibility of firing conductor paths jointly with the ceramic in the LTCC process.

To connect the circuit structures by means of wire conductors (lead wires), contact elements in the form of bonding pads or bonding islands are often provided on the ceramic substrate, which comprising an island are composed of a first metal layer arranged on the ceramic substrate. The wire conductors are used to electrically connect a circuit structure to further circuit structures, for example, a semiconductor chip. Electrically conductive materials such as gold, a gold alloy, copper or a copper alloy are therefore used as wire conductors. To produce the connection, the contact element is connected to the lead wire, for example, by means of soldering or other connecting methods (bonding).

Bonding (to be more exact: wire bonding) is used in electrical engineering to describe a joining technique in which a connection is produced between electronic elements of an electric circuit with the aid of a thin wire (wire connector, lead wire) by welding the wire with the land. The welding can be carried out, for example, by means of thermal activation (thermosonic bonding) or by means of ultrasound (ultrasonic bonding), the advantage of the ultrasound-supported wire bonding being that a bond connection can be generated at room temperature, wherein special prerequisites have to be met with gold wires for room temperature bonding. One of the prerequisites is, for example, the coating of the gold wires with aluminum. The aluminum, which deposits in islands, oxidizes to aluminum oxide. In the bonding process this coating serves as an abrasive medium that promotes the room temperature bonding process through an abrasive effect.

Soldering is a thermal method for joining materials by adhesive force, wherein a liquid phase is produced by melting a solder (melt soldering). The solidus temperature of the base materials is not reached during soldering. The solder material is an easily fusible metal alloy, with the aid of which a metallic connection of two metallic components is produced. The solder with the materials to be joined forms one or more intermetallic phases at the joint, which produces a firm connection of the materials to be joined to one another.

In order to produce a connection between the first metallization (also referred to below as metal layer) and the wire conductor, two different metallization types are currently used with the LTCC technology. The first variant is a pure gold system, wherein pure gold pastes supplemented with mixtures capable of being soldered (AuPtPd and the like) are used for printing. However, this is very cost-intensive. The second system is referred to as a so-called mixed metal system, which contains a number of agentiferous paste mixtures in addition to pure silver pastes, depending on the use.

If the gold pad and the silver-containing metallization lie one on top of the other, the problem arises that the noble metals gold and silver, which have different diffusion rates, come into direct contact, so that with the diffusion of both noble metals into one another a volume change occurs that causes a cavity formation (so-called Kirkendall voiding). The cavity formation can lead to a defective nature of the transition and thus to an interruption of the electrical connection, which cannot be tolerated in all of the substrates used in particular in medical technology.

A transition of this type has therefore hitherto usually been realized through so-called transition vias (through-hole plating) of an AgPd alloy, which, however, tend to a mushroom like growth out of the tape due to a mismatching to the tape through the sintering.

One solution of the problem described above would be the application of a diffusion barrier layer between the gold pad and the silver metallization by means of a plating method acting globally over the entire ceramic substrate on platable silver as the first metal layer. Plating is a currentless deposition of one material on another. However, a plating process of this type requires a large investment of time in the development of the process for the concrete application. Furthermore, the process is very error-prone. The substrate structures—and hereby in particular the connections—must operate without errors, in particular for medical applications. Moreover, there is the problem with plating that the baths used for the plating have to be loaded continuously in order to avoid a lasting change in their composition (transition). For smaller enterprises a production line that contains a plating step is therefore very expensive. The integral plating process is therefore not suitable for the application of the diffusion barrier layer in the case of small throughputs.

A method for an ink-jet printing of a contact element capable of being soldered on a substrate for the production of PCBs (printed circuit boards) is known from WO 2007/140463 A2. With PCBs, the mask and other structures are printed onto the finished substrate. In order to produce a contact element, with the known methods first of all a first layer is applied to a substrate with a first ink, wherein the first ink has a relatively high conductivity. This first layer is subsequently subjected to a thermal treatment. Subsequently an intermediate layer with a low conductivity is applied and subsequently likewise subjected to a thermal treatment. Finally, a second ink is applied to the intermediate layer, which ink is subsequently likewise thermally treated. The third layer serves to produce the soldered joint.

BRIEF SUMMARY OF THE INVENTION

The object of the present invention is therefore to disclose an LTCC substrate structure which has a reliable contact element that renders the application of a plating process superfluous or at least minimizes it. The object is further to disclose a simple and cost-effective method for producing an LTCC substrate structure.

The above object is attained through an LTCC substrate structure in which a diffusion barrier layer covering the first metallization or metal layer, which diffusion barrier layer is produced with a locally acting application method, and a second metal layer arranged on the diffusion barrier layer are provided, wherein the second metal layer preferably contains gold and/or platinum and/or an alloy that has at least one of these elements and can be wire bonded. Wire bonding capability means that bonding adhesions (e.g., 4.5 cN on average) sufficient according to MIL 883 are achieved. Depending on the layer thickness and material of the diffusion barrier layer, the bond adhesion is carried out either on the second metal layer (gold and/or platinum), but possibly also on the diffusion barrier layer.

The advantage of a substrate structure according to the invention is that a diffusion barrier layer can be applied so exactly locally that a subsequent application of a second metal layer is made possible. The advantage of the solution according to the invention lies in avoiding transition vias which tend to a mushroom-like growth in the mixed metal technology. Furthermore, the application of the error-prone plating technology can be avoided or reduced to a low proportion. A further metal layer can then be applied onto a diffusion barrier layer with any local or integral methods.

The diffusion barrier layer preferably contains nickel and/or a nickel alloy. This is a tried and tested metal that is often used, which is furthermore low in price and in the sintering temperature corresponds approximately to the required bake-out temperature. Alternatively or additionally the diffusion barrier layer can contain one or more elements from the group titanium, cobalt, chromium, tungsten, molybdenum.

In a particularly preferred exemplary embodiment the diffusion barrier layer is produced by means of printing. However, this method is suitable only for flat substrates without cavities, since the process described above is a so-called post-fire process and thus a printing is no longer possible in cavities that are already completely formed after the sintering.

A dispensing of a paste or ink or an ink jet method (also called jetting, local ink jet printing type method using suitable inks) are suitable for the local application of the corresponding layers in order to also be able to realize a contact element according to the invention in cavities. Depending on the nature of the paste or ink and the thickness of the layer applied, a tempering step is optionally necessary after the application of a diffusion barrier layer.

In a further exemplary embodiment the second metal layer is produced by means of plating. Due to the chemical contact series, a step of this type on a diffusion barrier layer is possible without special pre-treatment steps (in contrast to a deposition of base nickel on a noble silver layer).

In further exemplary embodiments the second metal layer is produced by means of printing or dispensing a paste or jetting.

The above object is furthermore attained through a method for producing an LTCC substrate structure given above in which first the substrate structure is provided with contact element, wherein the contact element has the first metal layer or metallization arranged on and/or in the ceramic substrate, subsequently the first metal layer or metallization is covered with the diffusion barrier layer by means of a locally acting application method and thereafter the second metal layer is arranged on the diffusion barrier layer.

A production method of this type makes it possible to realize a plurality of layouts, which previously had to be produced from pure gold, in particular for applications in medical technology, since secure contact elements are produced. Moreover, the above advantages cited in connection with the printed circuit board also apply to the method according to the invention.

In one exemplary embodiment of the method according to the invention the diffusion barrier layer is applied by means of printing and subsequently, before the application of the second metal layer, a tempering step is carried out. Preferably, the second metal layer is applied by means of printing with a subsequent tempering step or by means of plating. The diffusion barrier layer and/or the second metal layer can also be applied by means of jetting or dispensing a paste.

Preferably, a further tempering step can be carried out after the application of the second metal layer.

BRIEF DESCRIPTION OF THE FIGURES

Further objectives, features, advantages and possible applications of the invention are shown by the following description of an exemplary embodiment. All of the features described or shown in the figures form per se or in any combination the subject matter of embodiments of the invention, regardless of their summarization in the individual claims or their reference.

They show diagrammatically.

DETAILED DESCRIPTION OF THE INVENTION

Figure 1:
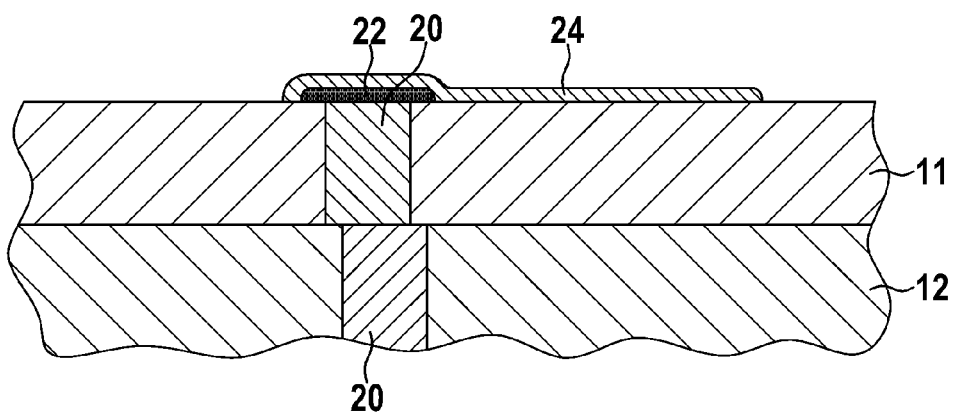
FIG. 1 A cross section through a first exemplary embodiment of a substrate structure according to the invention, FIG. 2 A cross section of a second exemplary embodiment of a substrate structure according to the invention, FIG. 3 A process step for producing the exemplary embodiment according to FIG. 1 and FIG. 4. An alternative process step for producing the exemplary embodiment according to FIG. 1.

The first exemplary embodiment in FIG. 1 shows two substrate layers 11, 12 lying one on top of the other, which were produced by means of LTCC. First metallizations in the form of silver through-hole platings (Ag via) 20 run through the first layer 11 and the second layer 12 of the substrate structure according to the invention, which through-hole platings connect the conductor structures beneath to the conductor structures or components arranged on the surface of the substrate structure. The through-hole platings 20 are embodied essentially cylindrically, wherein the through-hole plating 20 running through the substrate layer 11 forms part of the surface of the substrate structure lying above.

A diffusion barrier layer (also referred to below as a passivation layer) 22 is arranged on the through-hole plating 20 running in the upper substrate layer 11, which diffusion barrier layer contains nickel and/or a nickel alloy. This is locally applied by means of printing or dispensing a paste or jetting. The diffusion barrier layer completely covers the area of the through-hole plating 20 lying on the surface of the substrate layer 11 and also covers the adjoining areas of the substrate 11.

The diffusion barrier layer 22 is completely covered and masked by a second metal layer 24 lying thereon which contains gold and/or platinum and/or an alloy with gold and/or platinum. The second metal layer 24 is embodied in a wire bondable manner.

Figure 2:
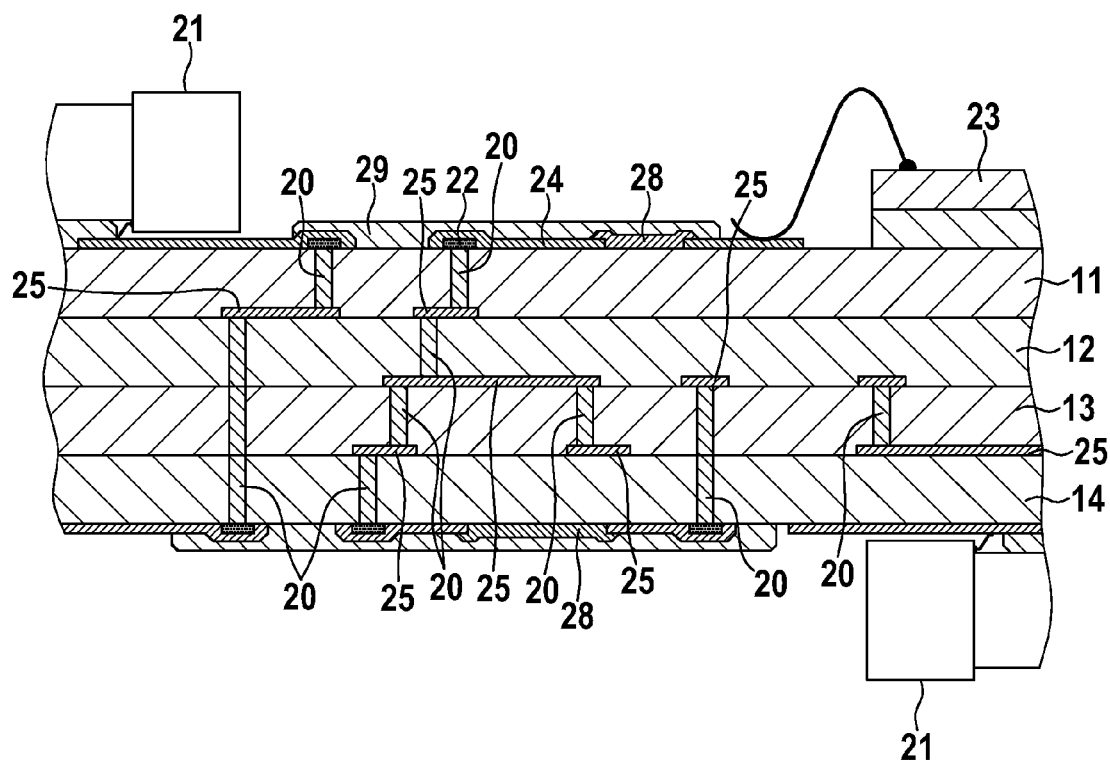

In the second exemplary embodiment of a substrate structure according to the invention shown in FIG. 2, four LTCC layers 11, 12, 13, 14 lie in this order one above the other. 25 (for example, of silver) are arranged between the layers, which conductor structures are also referred to as conductor tracks. Each conductor track 25 is connected by means of through-hole platings 20 either to the surface of the layer 11 or the layer 14 or to a further conductor track 25. All of the through-hole platings 20 contain silver and/or a silver alloy.

On the top (surface) of the layer 11 or the bottom (surface) of the layer 14 the silver through-hole platings 20 are provided with respectively a diffusion barrier layer 22 and respectively a second metal layer 24 lying above it and completely covering the passivation layer 22, wherein the second metal layer 24 contains an alloy containing gold and/or platinum. The second metal layer 24 is optionally connected to a resistor 28 arranged on the surface of the layer 11. In order to guarantee a greater protection, the resistors 28 are protected by means of a glassivation 29.

Further structures can be attached on the top and bottom of the substrate. In FIG. 2 active or passive components 21 and a chip 23 are shown. These components are either adhered or soldered onto the substrate or bonded onto the substrate.

Figure 3:
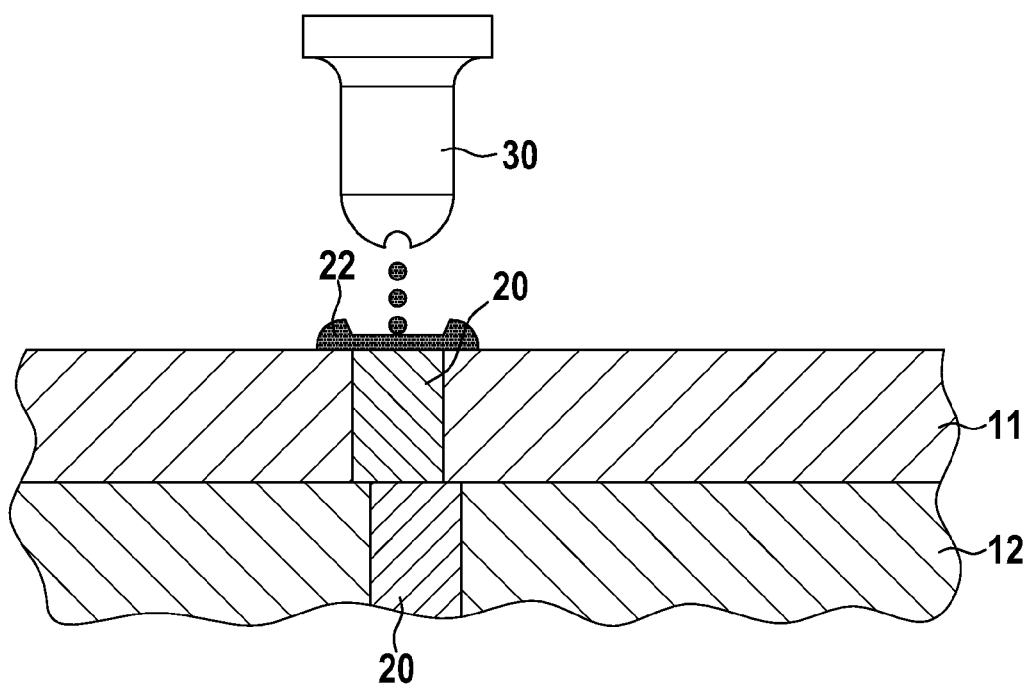

FIG. 3 shows how the diffusion barrier layer 22 is produced. In the method shown, the diffusion barrier layer 22 is applied by means of a dispenser or ink jet nozzle 30 in a liquid state onto the surface of the first substrate layer 11, where the through-hole plating 20 is arranged and forms a part of the surface. The diffusion barrier layer can be, for example, a nickel metal-containing ink or a low-viscosity paste. The material of the diffusion barrier layer is hereby applied to the location and in the quantity that the area of the surface of the first substrate layer 11 formed by the through-hole plating 20 is completely covered.

Figure 4:
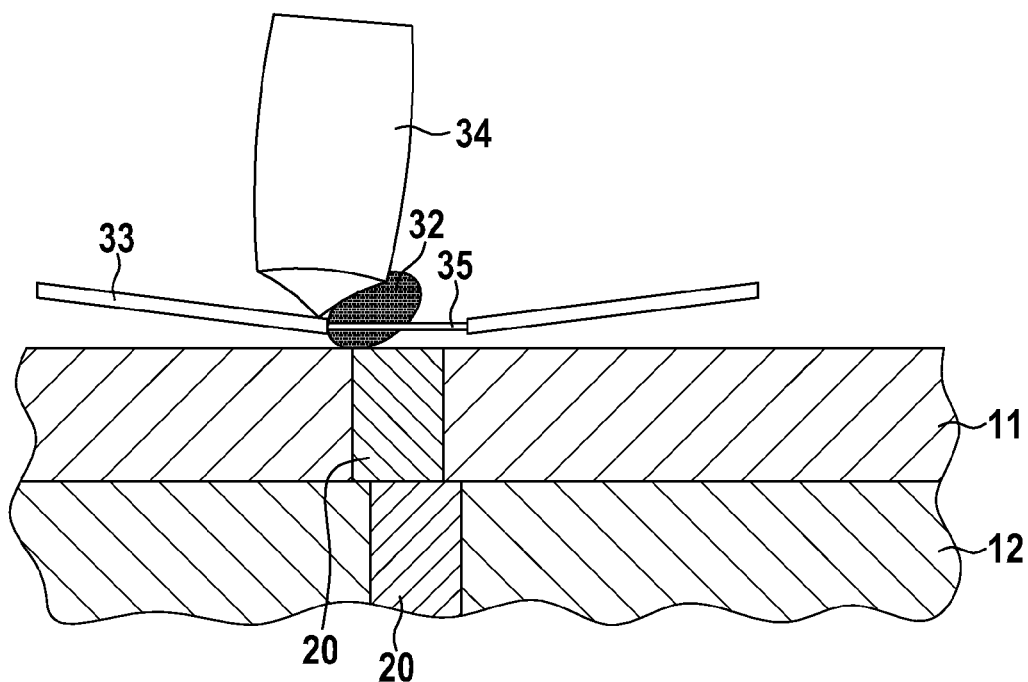

In the exemplary embodiment shown in FIG. 4, which forms an alternative to the exemplary embodiment according to FIG. 3, to produce a diffusion barrier layer 22 a screen 33 is placed on the surface of the first layer 11 with through-hole plating 20. Subsequently, for example, a nickel metal-containing screen printing paste 32 is applied to the screen 33 for the diffusion barrier layer. The nickel metal-containing screen printing paste 32 is distributed on the screen 33 by means of a doctor blade 34. The screen 33 has an opening in the coated emulsion on the screen 35 in the area in which the through-hole plating 20 forms a part of the surface of the first layer, so that in this area the screen printing paste 32 is applied onto the surface of the first layer 11 with through-hole plating 20.

After the application of the diffusion barrier layer 22, this is subjected to a temperature treatment (tempering step). The baking or the tempering step is carried out either in air or under a protective gas atmosphere that prevents an oxidation of the metal. Temperatures between 500° C. and 875° C. thereby prevail according to the type of paste and grain size of the metal powder in the paste.

LIST OF REFERENCE NUMERALS

11 First substrate layer/LTCC layer
12 Second substrate layer/LTCC layer
13, 14 Further substrate layers/LTCC layers
20 Through-hole plating, via
21 Active or passive component
22 Diffusion barrier layer
23 Chip
24 Second metal layer
25 Conductor track
28 Resistor
29 Glassivation
30 Dispenser, ink jet nozzle
32 Screen printing paste
33 Screen
34 Doctor blade
35 Opening in the coated emulsion on the screen (structuring)

What is claimed is:

1. A method for producing a low temperature cofired ceramics substrate structure comprising:
    providing the ceramic substrate with the at least one contact element, wherein the at least one contact element has a first metallization (20) arranged on the ceramic substrate or in the ceramic substrate or on and in the ceramic substrate;
    covering the first metallization (20) with a diffusion barrier layer (22) through printing or by jetting or dispensing; and,
    forming the second metal layer (24) directly on the diffusion barrier layer (22)
        without tempering said diffusion barrier layer before said forming the second metal layer on the diffusion barrier layer.

2. The method according to claim 1, wherein said forming the second metal layer (24) comprises
    printing with a subsequent tempering step, or,
    plating.

3. The method according to claim 1, further comprising applying the second metal layer (24) by jetting or dispensing a paste.

4. The method according to claim 1, further comprising carrying out a tempering step after said forming of the second metal layer (24).

5. A method for producing a low temperature cofired ceramics substrate structure comprising:
    providing the ceramic substrate with the at least one contact element, wherein the at least one contact element has a first metallization (20) arranged on the ceramic substrate or in the ceramic substrate or on and in the ceramic substrate;
    covering the first metallization (20) with a diffusion barrier layer (22) by printing or by jetting or dispensing a paste;
    forming the second metal layer (24) directly on the diffusion barrier layer (22) by printing or plating and
        without tempering said diffusion barrier layer before said forming the second metal layer on the diffusion barrier layer; and,
    carrying out a tempering step after said forming of the second metal layer (24).

* * * * *